United States Patent [19]
Okamura

[11] Patent Number: 5,670,893
[45] Date of Patent: Sep. 23, 1997

[54] BICMOS LOGIC CIRCUIT WITH BIPOLAR BASE CLAMPING

[75] Inventor: Hitoshi Okamura, Tokyo, Japan

[73] Assignee: NEC Corporation, Tokyo, Japan

[21] Appl. No.: 312,396

[22] Filed: Sep. 26, 1994

[30] Foreign Application Priority Data

Sep. 24, 1993  [JP]  Japan ................... 5-237620

[51] Int. Cl.⁶ ................................... H03K 17/0412
[52] U.S. Cl. ................................... 326/18; 326/84
[58] Field of Search ........................ 326/18, 30, 84, 326/110; 327/433

[56] References Cited

U.S. PATENT DOCUMENTS

| | | | |
|---|---|---|---|
| 3,641,368 | 2/1972 | Gamble et al. | 326/18 |
| 4,598,213 | 7/1986 | Marley et al. | 326/18 |
| 4,616,146 | 10/1986 | Lee et al. | 326/84 |
| 4,719,373 | 1/1988 | Masuda et al. | 326/110 |
| 4,825,108 | 4/1989 | Burton et al. | 326/30 |
| 5,059,821 | 10/1991 | Murabayashi et al. | 326/110 |
| 5,166,551 | 11/1992 | Kamuro | 326/84 |
| 5,343,092 | 8/1994 | Dhong et al. | 326/18 |

FOREIGN PATENT DOCUMENTS

| | | | |
|---|---|---|---|
| 58-120322 | 7/1983 | Japan | 362/18 |
| 3-295314 | 12/1991 | Japan | |

OTHER PUBLICATIONS

T. Nagano et al., "What Can Replace BiCMOS at Lower Supply Voltage Regime?", IEEE, 1992, pp. 393–396.

*Primary Examiner*—Edward P. Westin
*Assistant Examiner*—Benjamin D. Driscoll
*Attorney, Agent, or Firm*—Young & Thompson

[57] ABSTRACT

The invention provides a BiCMOS logic gate circuitry comprising: input and output terminals; an output driving section including two bipolar transistors in the form of totem pole connection between a high voltage line and a low voltage line in which an intermediate point between the two bipolar transistors is connected to the output terminal; a base driving section including a plurality of MOS transistors and being connected to an input terminal for receiving an input signal and connected to bases of the bipolar transistors; and a base clamping section including at least one clamping circuit being connected to at least one of the bipolar transistors through its base for restricting a base potential of the at least one bipolar transistor in the vicinity of the same potential as a base-emitter forward bias at which the bipolar transistor turns ON so as to reduce the necessary time for charging a parasitic capacitance of the base of the at least one bipolar transistor.

6 Claims, 5 Drawing Sheets

△ BiCMOS Invertor (Invention)
△ CMOS Invertor
C: Clock Input
$\overline{C}$: Reverse Phase Clock Input
I: Input
Q: Output
$\overline{Q}$: Reverse Phase Output

BICMOS LOGIC CIRCUIT WITH BIPOLAR BASE CLAMPING

BACKGROUND OF THE INVENTION

1. Field of Invention

The invention relates to semiconductor integrated circuits, and more particularly to an improvement in semiconductor BiCMOS logic circuits.

2. Description of the Related Art

Semiconductor integrated circuits including BiCMOS logic gate circuits have been known and BiCMOS circuits may be useful in the form of various logic circuits such as an invertor circuit. One of the conventional logic circuits including BiCMOS circuits will be described with reference to FIG. 1. The conventional BiCMOS logic circuit forms an invertor circuit that has an input terminal 1 and an output terminal 2 and is biased between a high voltage line 3 for supplying a high voltage $V_{CC}$ and a ground line 4 for supplying a ground voltage GND. The invertor circuit including the BiCMOS transistor comprises first and second npn bipolar transistors 17 and 18 and first and second base driving circuits 23 and 24. The first base driving circuit 23 is electrically connected to the input terminal 1 and a base of the first bipolar transistor 17. The second base driving circuit 23 is electrically connected to the input terminal 1 and a base of the second bipolar transistor 18. The first and second base driving circuits 23 and 24 are connected to each other between the high voltage line 3 and the ground line 4 in which the first base driving circuit 23 is connected to the high voltage line 3 and the ground line 4, while the second base driving circuit 24 is connected through the first base driving circuit 23 to the high voltage line 3 and connected to the ground line 4. The first base driving circuit 23 comprises complementary MOS transistor circuits including a first p-channel MOS transistor 19 and an n-channel MOS transistor 20. The first p-channel MOS transistor 19 has a gate electrode electrically connected to the input terminal 1, a source electrically connected to the high voltage line 3 and a drain electrically connected to the base of the first bipolar transistor 17. The second n-channel MOS transistor 20 has a gate electrode electrically connected to the input terminal 1, a source electrically connected to the ground line 4 and a drain electrically connected to the base of the first bipolar transistor 17 or connected to the drain of the p-channel MOS transistor 19. By contrast, the second base driving circuit 24 comprises a third n-channel MOS transistor 21 and a resistance 22. The third n-channel MOS transistor 21 has a gate electrode electrically connected to the input terminal 1, a source electrically connected through the resistance 22 to the ground line 4 and connected to the base of the second bipolar transistor 18 and a drain electrically connected to the output terminal 2. The first bipolar transistor 17 has the base electrically connected to the drains of the first p-channel and second n-channel MOS transistors 19 and 20, a collector electrically connected to the high voltage line 3 and an emitter electrically connected to the output terminal 2. The second bipolar transistor 18 has the base electrically connected to the source of the third n-channel transistor 21, a collector electrically connected to the output terminal 2 and an emitter electrically connected to the ground line 4.

The following descriptions will describe operations of the conventional BiCMOS invertor circuit as described above. When a potential of the input terminal 1 is shifted from a high level into a low level, the first p-channel MOS transistor 19 turns ON, while the second n-channel transistor 20 turns OFF. A parasitic capacitance of the first bipolar transistor 17 is charged so that a base potential of the first bipolar transistor 17 reaches a constant voltage $V_F$ at which the first bipolar transistor turns ON where the output terminal 2 and the emitter of the first bipolar transistor 17 have been at a ground potential. For the first and second npn bipolar transistors 17 and 18, a potential of the base region is always kept higher than a potential of the emitter by the voltage $V_F$ at which the bipolar transistor shows on/off switching operation where the voltage $V_F$ is the forward bias applied between the base and the emitter. The voltage $V_F$ is free from any bias between the collector and the emitter, but is defined by the material of the bipolar transistor and the size of the emitter. For any bipolar transistor, a difference in the Fermi level between the base region and the emitter region is always kept at the voltage $V_F$ provided that the bipolar transistor is in the on-state. Then, the potential of the output terminal 2 is raised and kept higher than the potential of the base of the first bipolar transistor 17 by the voltage $V_F$. On the other hand, the third n-channel MOS transistor 21 turns OFF so that a base current of the second bipolar transistor 18 comes into OFF thereby a charge that has been accumulated in the base region of the second bipolar transistor 18 is discharged and then flows through the resistance 22 to the ground line 4, resulting in that the second bipolar transistor 18 turns OFF. The discharge is continued until the potential of the base region of the second bipolar transistor reaches the ground level. Then, the potential of the output terminal 2 is raised up to a lower level by the voltage $V_F$ than the high voltage $V_{CC}$ so that the first bipolar transistor turns OFF so that the potential of the output terminal 2 is kept at a potential lower by the voltage $V_F$ than the high voltage $V_{CC}$. Then, the potential of the output terminal 2 is kept in the high level of $V_{CC}$-$V_F$. Consequently, when the input terminal 1 receives the low level signal, the high level signal $V_{CC}$-$V_F$ appears at the output terminal 2.

By contrast, the potential of the input terminal 1 is shifted from the low level to the high level, the first p-channel MOS transistor 19 turns OFF, while the second n-channel MOS transistor 20 turns ON at this time the first bipolar transistor 17 is still in the ON state. Then, the base potential of the first bipolar transistor is kept at a higher level by the voltage $V_F$ than the potential level of the emitter or the potential of the output terminal 2. A charge accumulated in the base region of the first bipolar transistor 17 is discharged and flows through the ON state second n-channel MOS transistor 20 to the ground line 4. Then, the base potential of the first bipolar transistor 17 is dropped down and kept at a higher potential level by the voltage $V_F$ than the emitter potential or the potential of the output terminal 2. When the base potential of the first bipolar transistor 17 comes into a lower level than the voltage $V_F$, the base current of the first bipolar transistor 17 comes into OFF so that the first bipolar transistor 17 turns OFF. On the other hand, the third n-channel MOS transistor 21 tuns ON by the shifting of the input signal into the high level so that the high voltage $V_{CC}$-$V_F$ of the output terminal before the potential drop is supplied to the base of the second bipolar transistor 18 through the ON state third n-channel MOS transistor 21 that makes the voltage level of the output terminal 2 be dropped thereby a parasitic capacitance of the base of the second bipolar transistor 18 is charged. Then, the base potential of the second bipolar transistor 18 is raised up to the voltage $V_F$ so that the second bipolar transistor 18 turns ON. Thereafter, the base potential of the second bipolar transistor 18 is kept at a higher level by the voltage $V_F$ than an emitter potential level. The turning ON of the second bipolar transistor 18 makes the output terminal 2 conductive to the ground line 4. This permits a rapid potential drop of the output terminal 2, resulting in a low potential level of the output terminal. Even if the gate of the third n-channel MOS transistor 21 is applied with the high voltage $V_{CC}$, the maximum bias applied between the gate and the source corresponds to the voltage $V_{CC}-V_F$ since the base potential of the second bipolar transistor 18 is kept at a higher level by the voltage $V_F$ than the emitter potential or the ground potential. The voltage $V_F$ is the constant valve described above. When the high voltage $V_{CC}$ is relatively small, then the bias between the gate and the source of the third n-channel transistor 21 is relatively small. Further, the third n-channel MOS transistor 21 has an increased threshold voltage $V_{th}$ due to the substrate effect caused by a substrate bias. The increased threshold voltage $V_{th}$ results in a delay in the turning ON of the third n-channel MOS transistor 21 as well as in a considerable reduction of a drain current of the third n-channel MOS transistor 21. This results in a delay in charging up of the base parasitic capacitance of the second bipolar transistor 18 thereby resulting in a delay in the turning ON of the second bipolar transistor 18. This provides a delay in the required rapid potential drop of the output terminal 2, for that reason the invertor circuit is incapable of showing a high speed performance. On the other hand, the second n-channel MOS transistor 20 is in THE ON state. Then, the base potential of the first bipolar transistor 17 is dropped down to the ground level.

To combat the above problem, it was proposed to enlarge a channel width of the third n-channel MOS transistor 21 to permit a large channel current of the third n-channel MOS transistor 21. This proposal, however, provides other problems in increase of an input capacitance of the gate circuits as well as in a difficulty in a high density integration of the gate circuits.

The description will focus on a power dissipation by the BiCMOS gate circuits with reference to FIG. 2. The power dissipation of the BiCMOS gate circuits may be considered to be divided into a power required in charging and discharging a load of the bipolar transistor and a power required in charging and discharging a parasitic capacitance of any transistor in the gate circuits. The power required in charging and discharging the parasitic capacitance of the transistor may be considered to be divided into powers required in charging and discharging the MOS transistor and the bipolar transistor respectively. The parasitic capacitance of the MOS transistor is almost proportional to the gate width or the channel width. Then, the power dissipation is also proportional to the gate width or the channel width of the MOS transistor as illustrated in FIG. 2 in which a measurement was carried out by use of an invertor chain circuit comprising a series connection of a plurality of invertor circuits. The load capacitance is the external factor that depends upon the state of the use of the gate circuits. Then, the power dissipation of the BiCMOS gate circuit primary depends upon the gate width of the MOS transistor.

Accordingly, in the conventional BiCMOS logic gate circuits, to have any of pull-up and pull-down bipolar transistors connected to the output terminal tuns ON, it is required to charge the base parasitic capacitance of the bipolar transistor until the base potential is raised from the ground level up to the voltage $V_F$. This results in that it is difficult to obtain the required reduction of the charging time or the high speed performance of the gate logic circuit. To achieve the required high speed performance, it is required to enlarge the gate width of the MOS transistors used for driving the base of the bipolar transistor thereby, however, resulting in the difficulties both in the high density integration of the gate logic circuit and in the reduction of the power dissipation. The above problems are more serious when the high voltage for driving the gate logic circuit is small.

SUMMARY OF THE INVENTION

Accordingly, it is a primary object of the present invention to provide a novel BiCMOS logic gate circuit free from any problem as described above.

It is an another object of the present invention to provide a novel BiCMOS logic gate circuit showing a high speed performance.

It is a still another object of the present invention to provide a novel BiCMOS logic gate circuit permitting a high density integration thereof.

It is yet an another object of the present invention to provide a novel BiCMOS logic gate circuit permitting a reduced power dissipation.

The above and other objects, features and advantages of the present invention will be apparent from the following descriptions.

The invention provides a novel BiCMOS logic gate circuitry that comprises an input terminal for receiving input logic signals; an output terminal connected to an external load for permitting output logic signals to be outputted; a push-pull circuit including first and second bipolar transistors electrically connected in series between a high voltage line and a low voltage line, and the push-pull circuit being connected to the output terminal through an intermediate point between the first and second bipolar transistors, a logic gate circuit including at least a pair of an n-channel MOS transistor and a p-channel MOS transistor and being electrically connected to bases of the first and second bipolar transistors and a gate of each of the n-channel and p-channel MOS transistors being electrically connected to the input terminal; and a clamping circuit being electrically connected to the logic gate circuit as well as being electrically connected to a base of at least one of the first and second bipolar transistors, the clamping circuit including at least a bipolar transistor for clamping a base potential of the one bipolar transistor in the vicinity of a potential level at which the bipolar transistor turns ON or OFF and the clamping circuit further including at least a resistance that provides the clamping circuit with an impedance sufficiently higher than an impedance of the base of the one bipolar transistor so as to have the most amount of a current supplied by the logic gate circuit be detected toward the base of the one bipolar transistor by suppressing the current to flow through the clamping circuit to thereby achieve a high speed and short time charging or discharging a parasitic capacitance of the base of the one bipolar transistor for permitting the push-pull circuit to exhibit high speed operations with a small power.

BRIEF DESCRIPTIONS OF THE DRAWINGS

Preferred embodiments of the present invention will hereinafter fully be described in detail with reference to the accompanying drawings.

FIG. 1. is a circuit diagram illustrative of the conventional BiCMOS logic gate circuit.

PREFERRED EMBODIMENT OF THE INVENTION

Figure 3:
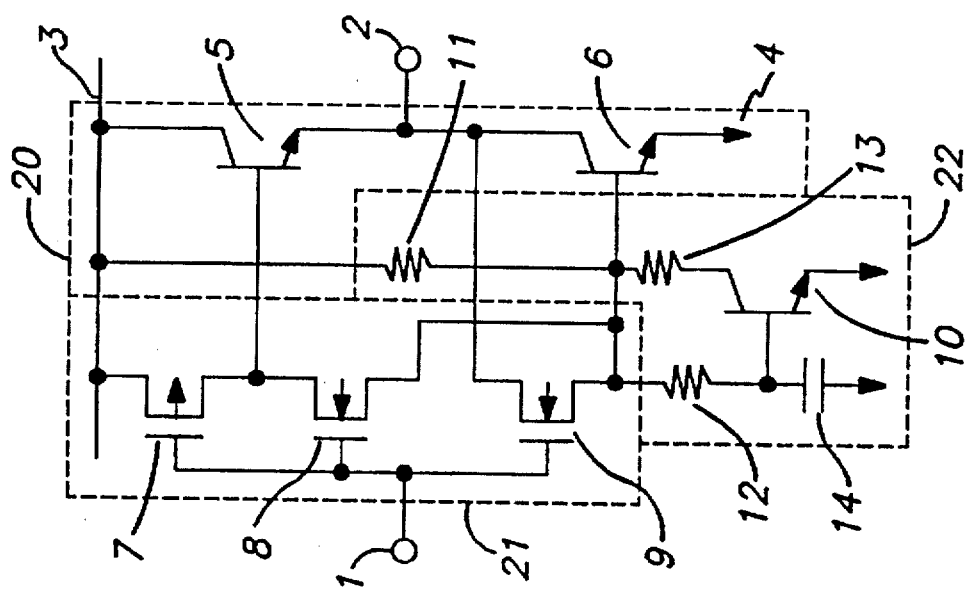
FIG. 3 is a circuit diagram illustrative of a novel BiCMOS logic gate circuit in a first embodiment according to the present invention.
Figure 1:
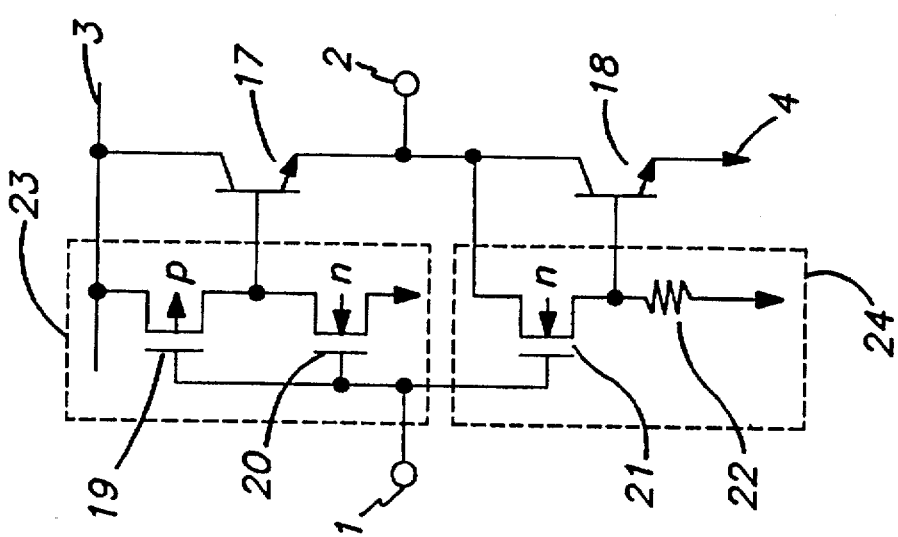
Figure 2:
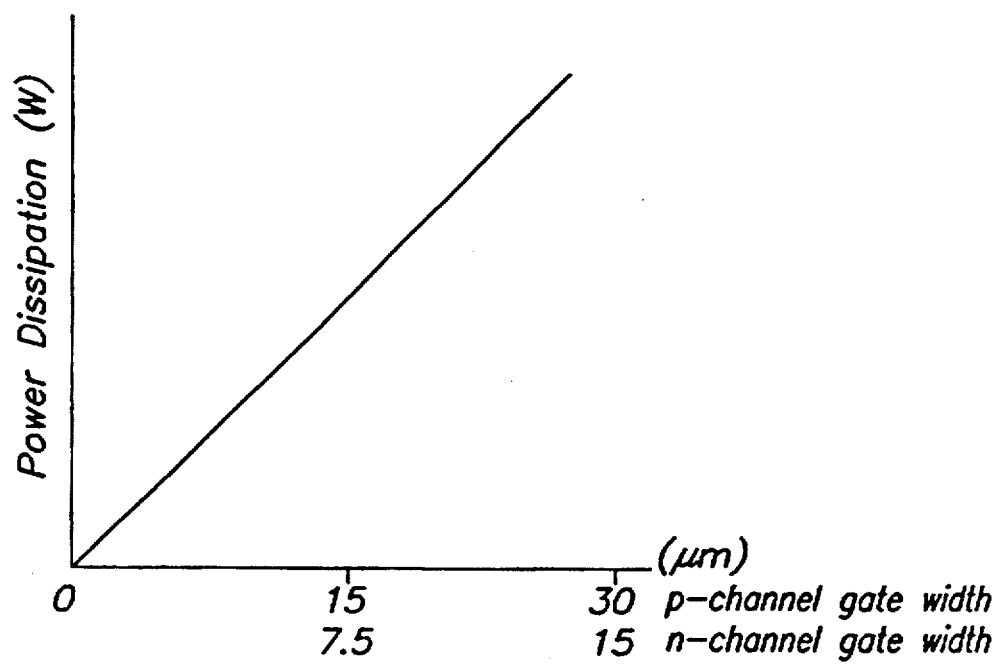
FIG. 2 is a diagram illustrative of a power dissipation verus a channel width in p-channel and n-channel MOS transistors.

A first embodiment according to the present invention will be described in detail with reference to FIG. 3 in which a novel BiCMOS gate logic circuit is provided, that may serve as an invertor circuit. The novel BiCMOS logic gate circuitry of the first embodiment is biased between a high voltage line 3 for supplying a high voltage $V_{CC}$ and a ground line 4 for supplying a ground voltage GND. The BiCMOS logic gate circuit in the form of the invertor circuit has an input terminal 1 for receiving an input signal and an output terminal 2 through which an output signal is outputted. The BiCMOS logic gate circuit comprises an output driving section 20 for generating an output signal, a base driving section 21 for driving an base of bipolar transistor involved in the output driving section 20 and a base cramping section 22 for clamping or restricting a base potential of one of the bipolar transistors involved in the output driving section 20 into the vicinity of a voltage $V_F$ as a base-emitter forward bias at which the bipolar transistor turns ON.

The output driving section 20 comprises first and second npn bipolar transistors 5 and 6 in the form of the totem pole connection between the high voltage line 3 and the ground line 4. The first bipolar transistor 5 has a base electrically connected to the base driving section 21 for being driven by the base driving logic circuit in the base driving section 21, a collector electrically connected to the high voltage line 3 and an emitter electrically connected to the output terminal 2. The second bipolar transistor 6 has a base electrically connected through the base clamping section 22 to the base driving section 21 so that the base potential of the second bipolar transistor 6 is kept or restricted in the vicinity of the voltage $V_F$ as a base-emitter forward bias at which the second bipolar transistor 6 turns ON, a collector electrically connected to the output terminal 2 and an emitter electrically connected to the ground line 4.

The base driving section 21 comprises a p-channel MOS transistor 7 and first and second n-channel MOS transistors 8 and 9. The p-channel MOS transistor 7 has a gate electrically connected to the input terminal 1 for receiving the input signal, a source electrically connected to the high voltage line 3 and a drain electrically connected to the base of the first bipolar transistor 5. The first n-channel MOS transistor 8 has a gate electrically connected to the input terminal 1 for receiving the input signal, a source electrically connected through the base clamping section 22 to the base of the second bipolar transistor 6 and a drain electrically connected to the base of the first bipolar transistor 5. The second n-channel MOS transistor 9 has a gate electrically connected to the input terminal 1 for receiving the input signal, a source electrically connected through the base cramping section 22 to the base of the second bipolar transistor 6 and a drain electrically connected to the output terminal 2.

The clamping section 22 may comprise a third npn bipolar transistor 10, first to third resistances 11, 12 and 13 and a capacitor 14. The first resistance 11 is electrically connected between the high voltage line 3 and the base of the second bipolar transistor 6. The second resistance 12 is electrically connected between the source of the second n-channel MOS transistor 9 in the base driving section 21 and one electrode of the capacitor 14 having the opposite electrode connected to the ground line 4. The third resistance 13 is electrically connected between the base of the second bipolar transistor 6 connected to the first resistance 11 and a collector of the third bipolar transistor 10 which has an emitter electrically connected to the ground line 4 and a base electrically connected to the intermediate point between the capacitor 14 and the second resistance 12. Then, the base of the second bipolar transistor 6 is electrically connected to the intermediate point between the first and third resistances 11 and 13. The above logic gate circuitry is designed to clamp the base potential of the second bipolar transistor 6. This will be apparent from the following descriptions as to the operation of the BiCMOS logic gate circuit acting as the invertor circuit.

The descriptions will focus on the operation of the BiCMOS logic gate circuit when the input signal applied to the input terminal 1 is shifted from a high level into a low level. When an input signal applied to the input terminal 1 is shifted from a low level to a high level, the p-channel MOS transistor 7 turns OFF, while the first and second n-channel MOS transistors 8 and 9 turn ON thereby a base potential of the first bipolar transistor 5 is dropped from the high voltage $V_{CC}$ where the first bipolar transistor is still in the ON state. Then, a potential of the output terminal 2 or an emitter potential of the first bipolar transistor 5 is also dropped from $V_{CC}-V_F$ with being kept lower than the base potential by the voltage $V_F$. As described above, for the first and second npn bipolar transistors 17 and 18, a potential of the base region is always kept higher than a potential of the emitter by the voltage $V_F$ at which the bipolar transistor shows on/off switching operation where the voltage $V_F$ is the forward bias applied between the base and the emitter. The voltage $V_F$ is free from any bias between the collector and the emitter, but is defined by the material of the bipolar transistor and the size of the emitter. For any bipolar transistor, a difference in the Fermi level between the base region and the emitter region is always kept at the voltage $V_F$ provided that the bipolar transistor is in the ON-state. The ON state of the first n-channel MOS transistor 8 permits a current flow from the base region of the first bipolar transistor 5 through the first n-channel MOS transistor 8 to the base region of the second bipolar transistor 6. Then, the second bipolar transistor 6 turns ON. A base potential of the second bipolar transistor 6 is held at the voltage $V_F$ by the cramping circuit of the base cramping section 22. A drain current of the first n-channel MOS transistor 8 is free from charge of a base parasitic capacitance of the second bipolar transistor but is supplied to the base of the second bipolar transistor 6 simply as the base current for switching ON thereby the second bipolar transistor 6 is allowed to show an immediate switching ON operation. The base potential of the first bipolar transistor 5 is clamped or restricted by the clamping circuit of the base clamping section 22 so as not to come into a lower level than the voltage $V_F$. When a load capacitance not illustrated but connected to the output terminal 2 is relatively large, a poor current is supplied from the base of the first bipolar transistor 5 through the first n-channel MOS transistor 8 to the base of the second bipolar transistor 6. Then, the base current of the second bipolar transistor 6 is insufficient thereby resulting in a difficulty in a rapid current induction from the output terminal 2 through the second bipolar transistor 6. The second n-channel MOS transistor 9 may ensure the base current of the second bipolar transistor 6 until the output voltage comes into the low level. The low level appearing at the output terminal 2 is so cramped or restricted as not to come into a lower level than the voltage $V_F$. Then, this may prevent any forward bias between the base and collector of the second bipolar transistor 6. This may keep the second bipolar transistor 6 from any saturation state. Further, the second n-channel MOS transistor 9 may prevent any leakage current of the first bipolar transistor 5 as well as irreversible voltage level increase of the output terminal 2 due to any noise and the like on a wiring line connected to the output terminal 2. This may prevent any error operation of the logic gate circuit. Then, the output voltage of the output terminal 2 is dropped from the high level $V_{CC}$-$V_F$ down to the low level $V_F$.

As described above, the base potential of the second bipolar transistor 6 is clamped or restricted in the vicinity of the voltage $V_F$. Therefore, no or almost no charge of the parasitic capacitance of the base region of the second bipolar transistor 6 is required. This results in an immediate or high speed switching ON operation of the second bipolar transistor 6 thereby permitting a rapid or high speed output voltage drop of the output terminal 2. No or about no requirement to charge the parasitic capacitance of the base region of the second bipolar transistor 6 may further permit a very small gate width or a very small channel width of the first and second n-channel MOS transistor. In the conventional BiCMOS logic gate circuit applied with a voltage of 5 V, the second n-channel MOS transistor requires a gate width equal to or wider than 10 micrometers. The lowering of the high power source voltage requires a further enlargement of the gate width of the MOS transistor. A ratio of the gate length to the gate width not more than 1:10 results in a considerable slow of speed in operation of the MOS transistor. By contract, the novel BiCMOS logic gate circuitry including the base clamping circuit is quite different from the prior art. When the power source voltage or the high voltage is only 2.5 V, a small gate width of only 1 micrometer is acceptable to the second n-channel MOS transistor 9. Namely, a ratio of the gate length and the gate width being 1:2.5 may prevent any deterioration of a high speed performance. The small gate width of the MOS transistor may furthermore allow a considerable improvement in integration of the logic gate circuit as well as a considerable reduction of the power dissipation. The above future of the present invention may moreover allow the novel BiCMOS logic gate circuits to be driven by a low power source voltage without any deterioration of the circuit performance in the high speed.

A subsequent description will focus on the operation of the novel logic gate circuits when the input level of the input terminal 1 is shifted from the high level to the low level. Then, the p-channel MOS transistor 7 turns ON, while the first and second n-channel MOS transistors 8 and 9 turn OFF thereby the base potential of the first bipolar transistor 5 is raised. The emitter potential of the first bipolar transistor 5 or the output potential of the output terminal 2 is also raised with being kept at a lower potential level by the voltage $V_F$ than the base potential. A speed of the potential raising is the same between the base potential and the output potential of the output terminal 2. The speed of the potential raising is defined by both the load capacitance not illustrated but connected to the output terminal 2 and an emitter current of the first bipolar transistor 5. The emitter current has the maximum value defined by the high injection effect of the bipolar transistor.

At the same time of switching ON of the first bipolar transistor 5, the base current of the second bipolar transistor 6 comes into OFF by the OFF states of the first and second n-channel MOS transistors 8 and 9. Then, the second bipolar transistor 6 turns OFF. The base potential of the second bipolar transistor 6 is held in the vicinity of the voltage $V_F$ by the clamping circuits of the base clamping section 22. Since the second bipolar transistor 6 is in a saturation state, it is not required to have the base potential of the second bipolar transistor 6 lower than the voltage $V_F$ for discharge of any excess carrier.

When the input low level of the input terminal 1 is equal to the ground level, the maximum value of the bias between the gate and source of the p-channel MOS transistor 7 for driving the first bipolar transistor 5 corresponds to the power source voltage or the high voltage $V_{CC}$. For the p-channel MOS transistor 7, the source potential and the substrate potential are the same as the high voltage $V_{CC}$. Then, the p-channel MOS transistor 7 is free from any disadvantage of increase of the threshold voltage $V_{th}$. This may prevent any reduction of the drain current of the p-channel MOS transistor 7 caused by the reduction of the high voltage $V_{CC}$ as the power source voltage. The MOS transistors has recently been improved in increase of the mutual conductance and a reduction of a diffusion capacitance, while the bipolar transistor has also been improved in a reduction of the base parasitic capacitance. Such improvements for the MOS and bipolar transistors may permit a small gate width of the p-channel and the first n-channel MOS transistors 7 and 8.

A subsequent description will focus on the operation of the clamping circuit of the base clamping section 22. The third bipolar transistor 10 in the base clamping section 22 in the ON state has a current defined by the first resistor 11 in the base clamping section 22. The value of the current of the third bipolar transistor 10 is to not more than 100 micro-A where a base current of the third bipolar transistor 10 is several micro-A. The second resistor 12 having a resistance not more than several K ohm provides an unappreciable amount of the potential drop for example several mV. Then, the base potential of the second bipolar transistor 6 may be considered to be the same as the base potential of the third bipolar transistor 10.

The ON-state of the first n-channel MOS transistor 8 may permit the clamping of the base potential of the first bipolar transistor 5 in the OFF state as well as the base potential of the third bipolar transistor 10. The first bipolar transistor 5 in the OFF state and the second bipolar transistor 6 in the ON state have the same small current not more than 10 micro-A as the third bipolar transistor 10. Variations of the value of the voltage $V_F$ or the dependency upon temperature may be compensated by use of the same size transistor as the first to third bipolar transistor 5, 6 and 10 to be limited within 100 mV. Then, the variations of the currents of the first bipolar transistor 5 in the ON state and the second bipolar transistor in the OFF state may be considered to depend upon a variation of the resistance of the first resistor 11 and tempeature only to be limited within a 30% variation from 100 micro-A. Accordingly, the clamping circuit of the base clamping section 22 may clamp or restrict the base potential of the second bipolar transistor 6 slightly below the voltage $V_F$. Therefore, no or almost no charge of the parasitic capacitance of the base region of the second bipolar transistor 6 is required. This results in an immediate or high speed switching ON operation of the second bipolar transistor 6 thereby permitting a rapid or high speed output voltage drop of the output terminal 2. Then, this may permit a high speed performance of the logic gate circuit as the invertor circuit as well as a high density integration and a considerable reduction of the power dissipation.

The above described clamping circuit has a further function to control a current flowing through itself. When the first and second n-channel MOS transistors 8 and 9 turn ON, the ON current thereof is divided into the second and third bipolar transistors 6 and 10. A transient response time fT is delayed by the capacitance 14 connected between the base of the third bipolar transistor 10 and the ground line 4 to which the emitter of the third bipolar transistor 10 is connected. This may prevent that the currents of the first and second n-channel MOS transistors 8 and 9 flow into the clamping circuit of the base clamping section 22 and then may permit that the currents to flow into the base of the second bipolar transistor 6. Even if the delay of the transient response time of the third bipolar transistor 10 is insufficient due to a large load capacitance, the second and third resistors 12 and 13 may successively control the current of the third bipolar transistor 10. Namely, the capacitor 14 and the second and third resistors 12 and 13 may ensure that the clamping circuit has a larger impedance than an impedance of the second bipolar transistor 6 so that the currents of the first and second n-channel MOS transistors 8 and 9 flow in a high efficiency into the base of the second bipolar transistor 6. Resistances of the first to third resistors 11, 12, and 13 are variable in the range of from 0 to several ten K-ohm to match the conditions such as a value of the load.

As modification of the embodiment, the base clamping section of the novel BiCMOS logic gate circuits may comprise various clamping circuits as illustrated in FIGS. 4A to 4E.

Figure 5:
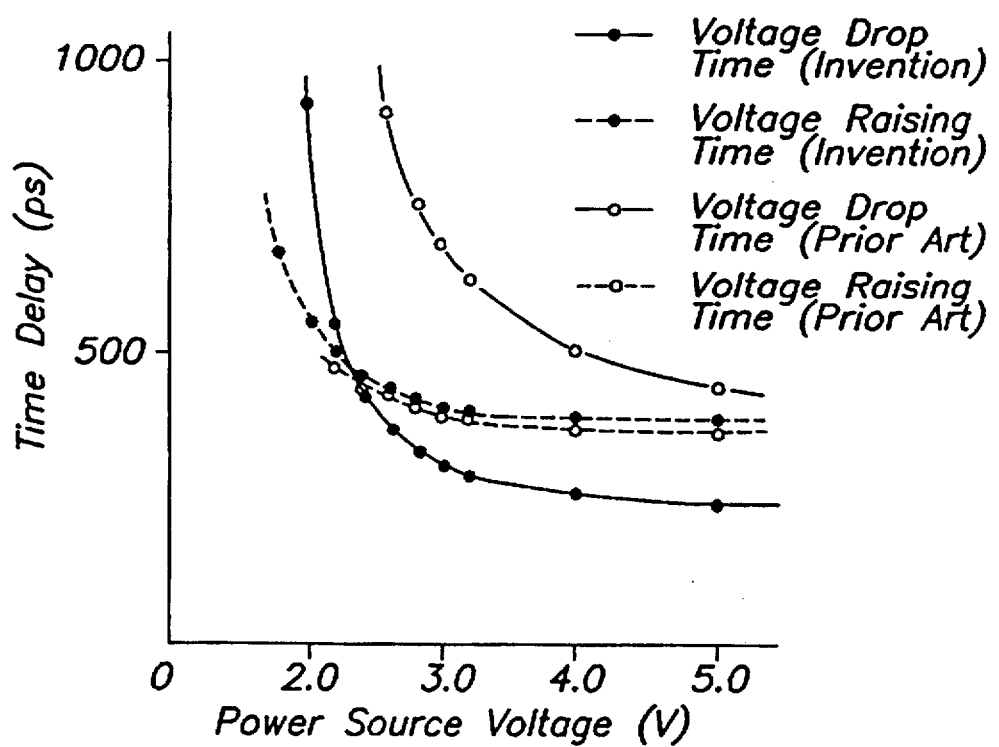
FIG. 5 is a diagram illustrative of time delays of signal transmissions versus power source voltages.
Figure 4A:
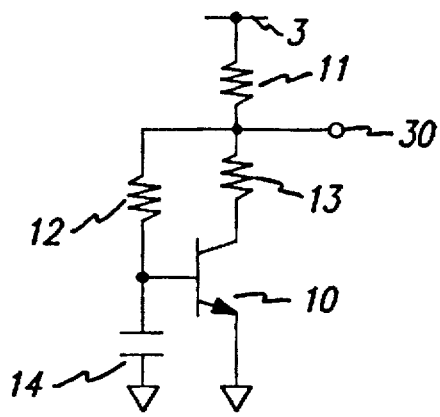
FIGS. 4A to 4E are circuit diagrams illustrative of clamping circuits to be involved in a novel BiCMOS logic gate circuit in a first embodiment according to the present invention.
Figure 4C:
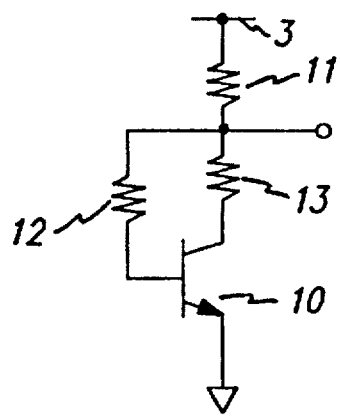
Figure 4B:
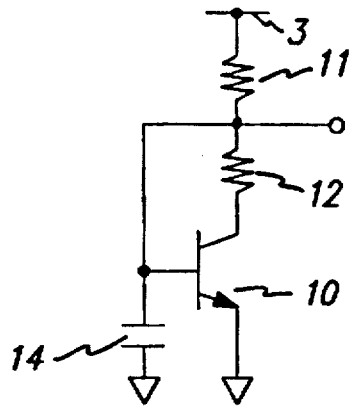
Figure 4D:
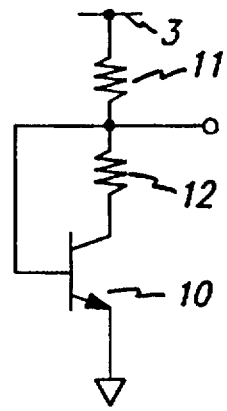
Figure 4E:
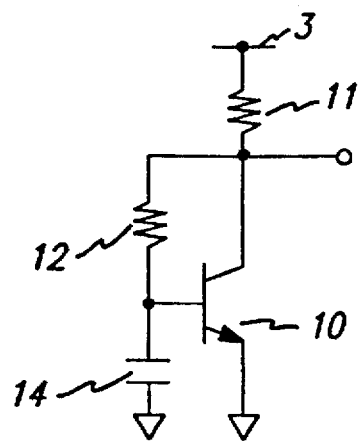

The description will subsequently focus on the performance speed of the novel and conventional BiCMOS logic gate circuits with reference to FIG. 5. For the novel logic gate circuit, the p-channel MOS transistor 7 has a gate length of 0.5 micrometers and a gate width of 3 micrometers, while the first and second n-channel MOS transistors 8 and 9 have the same gate length of 0.4 micrometers and a gate width of 1 micrometers. For the conventional logic gate circuits, each of the p-channel and n-channel MOS transistors has the same gate length and width as the corresponding one of the conventional circuits. The measurements were carried out under the same input fan-in capacitance of 13.7 pF for comparison. The load capacitance is 1 pF. It could be appreciated that the novel circuits have an almost time of the conventional circuit for voltage drop of the output voltage under the wide range of the power source voltage. The minimum value of the available power source voltage of the novel circuit is lower by 1 V or more than that of the conventional circuit.

Figure 6:
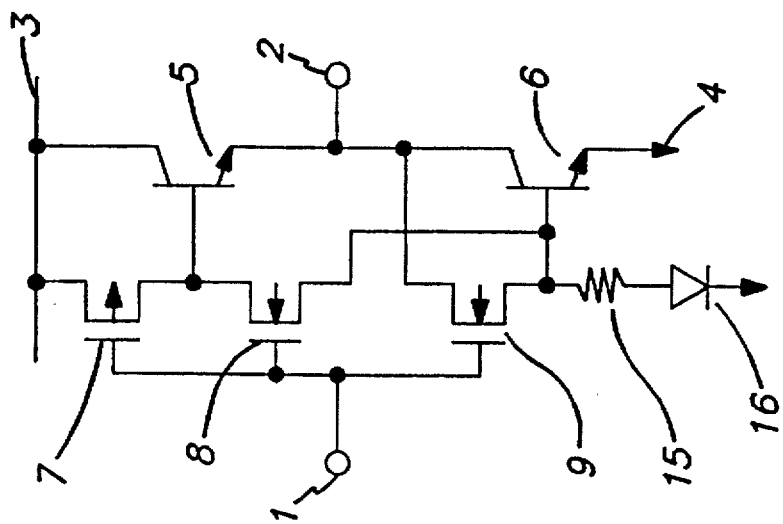
FIG. 6 is a circuit diagram illustrative of a novel BiCMOS logic gate circuit in a second embodiment according to the present invention.

A second embodiment according to the present invention will be described with reference to FIG. 6 in which another novel BiCMOS logic gate circuit is provided. The novel BiCMOS logic gate circuit of the second embodiment has the same circuit configuration except for the base clamping circuit. The base clamping section may comprise a single resistance and a diode both of which are connected in series between the second n-channel MOS transistor and the ground line. The operation and effect of the novel circuit of the second embodiment are essentially the same as those of the first embodiment. The clamping circuit of this embodiment having the simplicity in the circuit configuration may permit a higher density integration.

Figure 7:
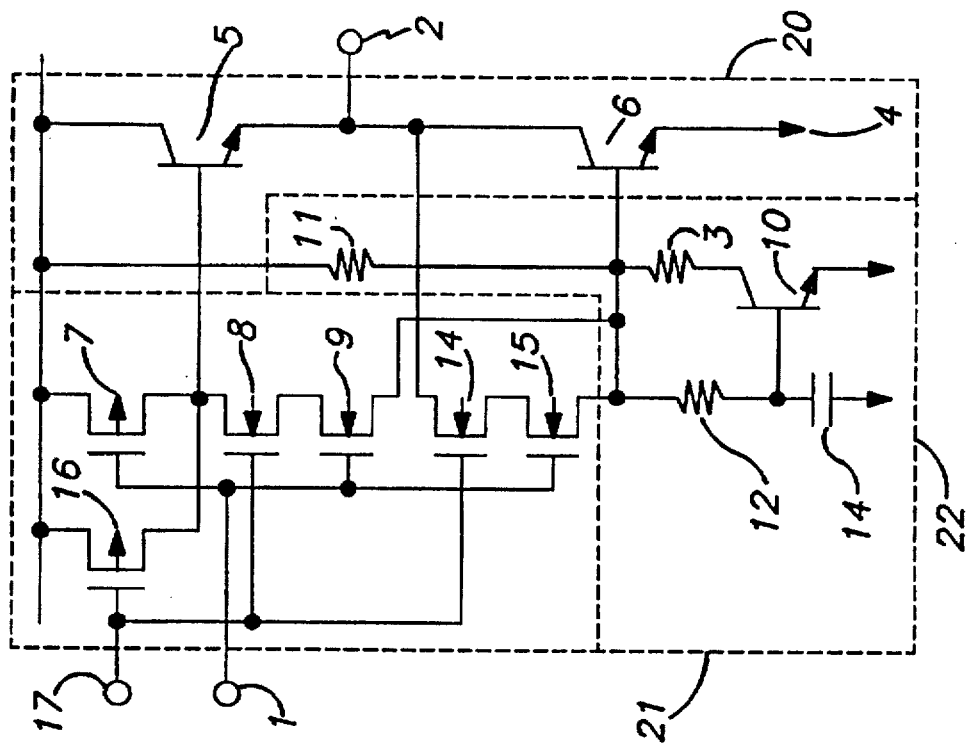
FIG. 7 is a circuit diagram illustrative of a novel BiCMOS logic gate circuit in a third embodiment according to the present invention.
Figure 8:
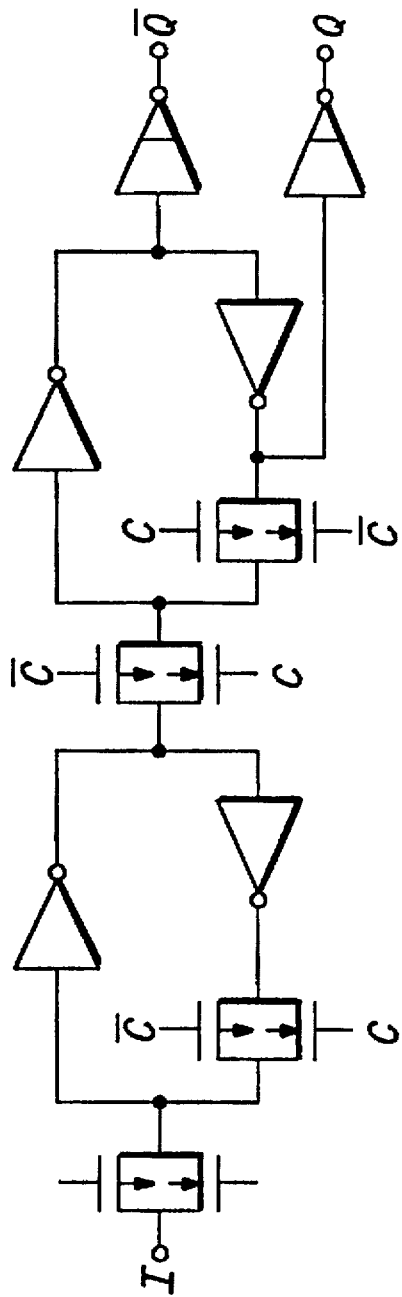
FIG. 8 is a circuit diagram illustrative of a novel BiCMOS logic gate circuit in a fourth embodiment according to the present invention.

Needless to say, the present invention is applicable to any logic circuits, for example, two-input NAND gate as illustrated in FIG. 7, NOR gate and flip-flop as illustrated in FIG. 8. Furthermore, in place of the npn bipolar transistors, pnp bipolar transistors may be available. Moreover, the clamping circuit may be provided to clamp the base of the first bipolar transistor. Other clamping circuit than those as described and illustrated above may be available to match various conditions of the logic gate circuit.

Whereas modifications of the present invention will no doubt be apparent to a person having ordinary kill in the art, to which the invention pertains, it is to be understood that the embodiments shown and described by way of illustrations are by no means intended to be considered in a limiting sense. Accordingly, it is to be intended to cover by claims any modifications of the invention which fall within the sprit and scope of the invention.

What is claimed is :

1. A BiCMOS logic gate circuitry comprising:

an input terminal for receiving input logic signals having a high level which is the same as a power source;

an output terminal connected to an external load for permitting output logic signals to be outputted;

a CMOS circuit having an input side which is connected to said input terminal for receiving said input signals and having an output side from which clamping-free logic signals are outputted;

an output pull-up bipolar transistor connected in series between a high voltage line and said output terminal, said output pull-up bipolar transistor having a base which is connected to an output side of said CMOS circuit for allowing said output pull-up bipolar transistor to be driven by said clamping-free logic signals;

an output pull-down bipolar transistor connected in series between a low voltage line and said output terminal so as to form a series connection of said output pull-up and output pull-down bipolar transistors between said high and low voltage lines, said output pull-down bipolar transistor having a base connected to said CMOS circuit so that said CMOS circuit is biased between said high voltage line and said base of said output pull-down bipolar transistor;

a clamping circuit biased between said high and low voltage lines, said clamping circuit having a clamping terminal which is connected to said base of said output pull-down bipolar transistor for clamping a base potential of said output pull-down bipolar transistor which is lower than a threshold potential level at which said output pull-down bipolar transistor turns ON and OFF and which is higher than ground voltage, and said clamping circuit further having a higher impedance that an input impedance of said base of said output pull-down bipolar transistor; and an n-channel MOS field effect transistor having a gate which is connected to said input terminal for receiving said input logic signals, said n-channel MOS field effect transistor being connected in series between said output terminal and said base of said output pull-down bipolar transistor for clamping a low level of said output logic signals appearing on said output terminal to said base potential clamped by said clamping circuit to thereby prevent said output pull-down bipolar transistor from entering into a saturation state.

2. The BiCMOS logic gate circuitry as claimed in claim 1, wherein said clamping circuit comprises:

a first resistance having a first end connected to said high voltage line and a second end connected to said base of said output pull-down bipolar transistor;

a second resistance having a first end connected to said base of said output pull-down bipolar transistor and a second end;

a third resistance having a first end connected to said base of said output pull-down bipolar transistor and a second end;

a capacitance having one electrode connected to said second end of said second resistance and an opposite electrode connected to said low voltage line; and a bipolar transistor having a base connected to said one electrode of said capacitance, a collector connected to said second end of said third resistance and an emitter connected to said low voltage line.

3. The BiCMOS logic gate circuitry as claimed in claim 1, wherein said clamping circuit comprises:

a first resistance having a first end connected to said high voltage line and a second end connected to said base of said output pull-down bipolar transistor;

a second resistance having a first end connected to said base of said output pull-down bipolar transistor and a second end;

a capacitance having one electrode and an opposite electrode connected to said low voltage line; and a bipolar transistor having a base connected to said one electrode of said capacitance and connected to said base of said output pull-down bipolar transistor, a collector connected to said second end of said second resistance and an emitter connected to said low voltage line.

4. The BiCMOS logic gate circuitry as claimed in claim 1, wherein said clamping circuit comprises:

a first resistance having a first end connected to said high voltage line and a second end connected to said base of said output pull-down bipolar transistor;

a second resistance having a first end connected to said base of said output pull-down bipolar transistor and a second end;

a third resistance having a first end connected to said base of said output pull-down bipolar transistor and a second end; and a bipolar transistor having a base connected to said second end of said second resistance, a collector connected to said second end of said third resistance and an emitter connected to said low voltage line.

5. The BiCMOS logic gate circuitry as claimed in claim 1, wherein said clamping circuit comprises:

a first resistance having a first end connected to said high voltage line and a second end connected to said base of said output pull-down bipolar transistor;

a second resistance having a first end connected to said base of said output pull-down bipolar transistor and a second end; and a bipolar transistor having a base connected to said base of said output pull-down bipolar transistor, a collector connected to said second end of said second resistance and an emitter connected to said low voltage line.

6. The BiCMOS logic gate circuitry as claimed in claim 1, wherein said clamping circuit comprises:

a first resistance having a first end connected to said high voltage line and a second end connected to said base of said output pull-down bipolar transistor;

a second resistance having a first end connected to said base of said output pull-down bipolar transistor and a second end;

a capacitance having one electrode and an opposite electrode connected to said low voltage line; and a bipolar transistor having a base connected to said second end of said second resistance and connected to said one electrode of said capacitance, a collector connected to said base of said output pull-down bipolar transistor and an emitter connected to said low voltage line.

* * * * *